(12) United States Patent
Veneklasen

(10) Patent No.: US 6,300,630 B1
(45) Date of Patent: Oct. 9, 2001

(54) ANNULAR DIFFERENTIAL SEAL FOR ELECTRON BEAM APPARATUS USING ISOLATION VALVE AND ADDITIONAL DIFFERENTIAL PUMPING

(75) Inventor: Lee H. Veneklasen, Castro Valley, CA (US)

(73) Assignee: Etec Systems, Inc., Hayward, CA (US)

( * ) Notice: Subject to any disclaimer, the term of this patent is extended or adjusted under 35 U.S.C. 154(b) by 0 days.

(21) Appl. No.: 09/458,583

(22) Filed: Dec. 9, 1999

(51) Int. Cl.$^7$ ........................................... H01J 37/09
(52) U.S. Cl. ............................................................ 250/310
(58) Field of Search ........................ 257/429; 250/370.01, 250/505.1, 503.1, 310

(56) References Cited

U.S. PATENT DOCUMENTS

| | | | |
|---|---|---|---|
| 4,524,261 | 6/1985 | Petric et al. | 219/121 EL |
| 4,528,451 | 7/1985 | Petric et al. | 250/441.1 |
| 4,560,880 | 12/1985 | Petric et al. | 250/441.1 |
| 4,584,479 | 4/1986 | Lamattina | 250/441.1 |
| 4,607,167 | 8/1986 | Petric | 250/492.2 |
| 5,784,925 | 7/1998 | Trost et al. | 74/490.09 |
| 5,838,006 | * 11/1998 | Veneklasen et al. | 250/310 |
| 5,900,667 | * 5/1999 | Veneklasen et al. | 257/429 |

* cited by examiner

Primary Examiner—Jack Berman
Assistant Examiner—Johnnie L Smith, II

(57) ABSTRACT

A vacuum seal facilitates the production of a vacuum with a localized region on the surface of a substrate, such as a semiconductor wafer or reticle, which is subject to electron beam lithography. The vacuum seal permits vacuum processing in a localized region while allowing the remainder of the substrate and its supporting stage to be outside the vacuum. In addition to conventional concentric differential pumping of vacuum zones to provide adequate vacuum, additional differential pumping is provided in the vertical direction where a lower vacuum level is maintained immediately above the substrate. Also, an isolation valve is provided between the high vacuum of the electron beam column and the lesser vacuum immediately above substrate. This valve allows isolation of the high vacuum surrounding the beam during times when the gap between an edge of the substrate and its coplanar carrier surface are directly under the vacuum seal. This protects the high vacuum during substrate loading and unloading.

13 Claims, 1 Drawing Sheet

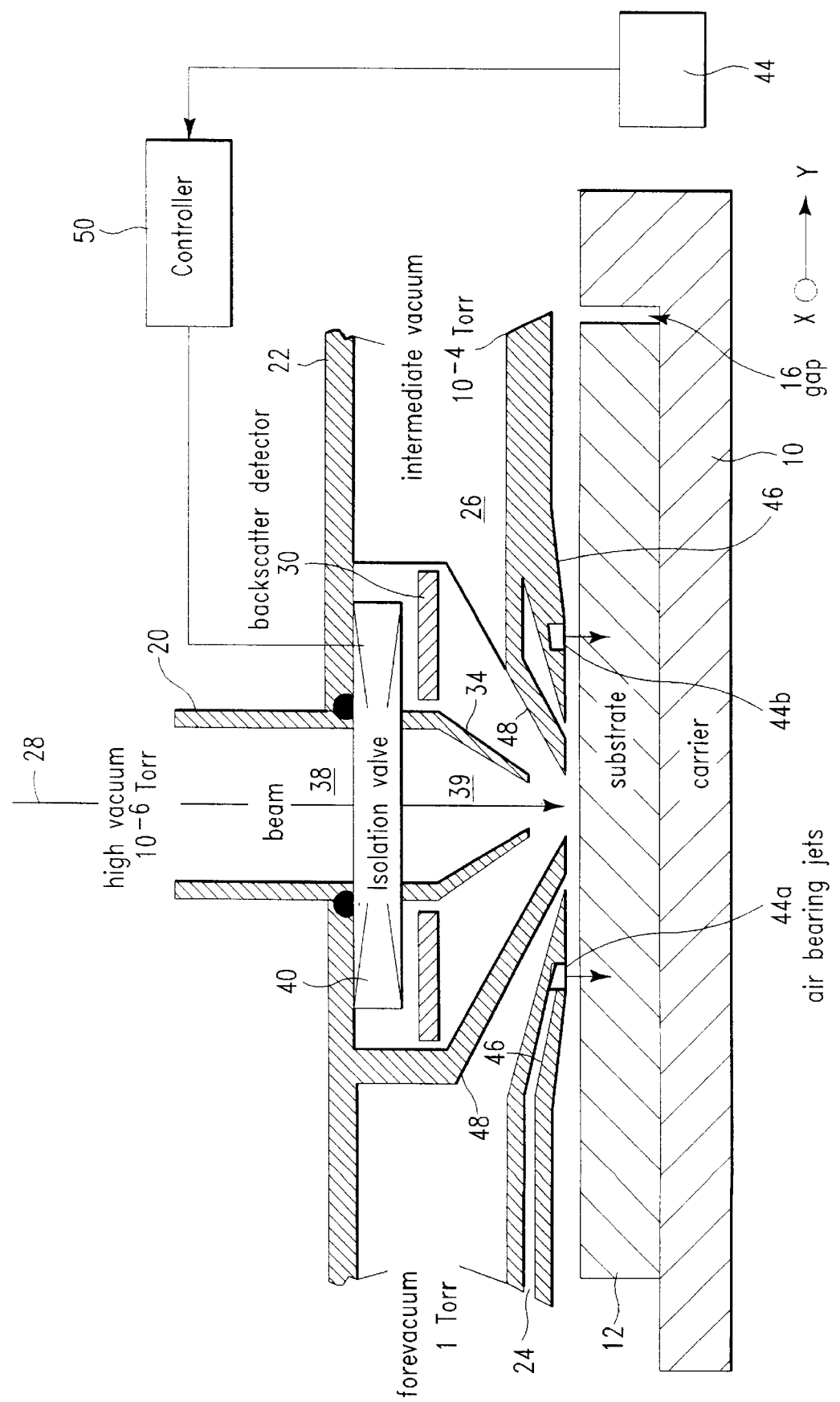

ANNULAR DIFFERENTIAL SEAL FOR ELECTRON BEAM APPARATUS USING ISOLATION VALVE AND ADDITIONAL DIFFERENTIAL PUMPING

FIELD OF THE INVENTION

This invention relates to localized vacuum processing of a workpiece and more particularly to a localized vacuum seal suitable for use in a charged particle beam system.

BACKGROUND

Localized vacuum seals are well-known for use in the semiconductor processing industry. For an example of a local vacuum seal, see Petric U.S. Pat. No. 4,607,167 incorporated herein by reference in its entirety.

Charged particle beam lithographic machines typically include within contiguous vacuum regions a beam source, beam steering and forming elements, a stage for a semiconductor wafer or a mask (the workplace) and a mechanism to move the stage with respect to the beam. For electron beam lithography, the beam source is an electron beam source and the beam steering and forming elements are an electron optical column. For focused ion beam lithography the beam source is an ion beam source and the beam steering and forming elements are ion deflection and focusing elements.

It is known from the above-referenced patent document to include what is called there an envelope apparatus coupled to the lower end of the electron beam column. The tip of the envelope apparatus rests slightly above the surface of the workpiece which is a semiconductor wafer (or a mask blank) mounted on a carrier and moving stage. Very small gaps are maintained between the tip of the envelope and the surface of the wafer. These gaps form a graded (differentially pumped) vacuum seal when the machine is in operation. Since the envelope tip is a truncated circular cone, a radial seal is thereby formed. This advantageously allows the stage supporting the wafer to be outside the vacuum. Hence a relatively small sized vacuum enclosure is possible while keeping the electron beam within the vacuum, which is necessary for its propagation.

Within the vacuum envelope, concentric conical members establish discrete zones, each zone being in communication with an associated vacuum pump. The vacuum is graded from the pressure of the ambient atmosphere, to a low vacuum level produced by the first stage vacuum pump, to a higher vacuum level formed by a second stage vacuum pump, to the vacuum along the beam path formed by a high vacuum pump in communication with the central portion of the envelope. Outside the largest seal is a ring of air bearings that are supplied with compressed air, supplied at an appropriate pressure to produce an air bearing effect between the surface of the vacuum envelope and the surface of the wafer. Typically these air bearings are air jets spaced along a circle and supplied with air from an annular groove outside the vacuum.

Related disclosure is also found in Lamattina, et al., U.S. Pat. No. 4,584,479; Petric, et al., U.S. Pat. No. 4,524,261; Petric, et al., U.S. Pat. No. 4,528,451 and Young, et al., U.S. Pat. No. 4,818,838, all incorporated herein by reference in their entireties.

However, the present inventor has identified certain deficiencies in the above-referenced vacuum seals. The above-mentioned patent documents do not appear to recognize or mention one problem introduced by their vacuum seals. This problem typically occurs during loading and unloading of the workpiece substrate (mask or wafer). In this case, the substrate, which sits on a carrier (a portion of the stage), typically sits in a recess in the carrier. Ideally the carrier is configured so that the depth of the recess is exactly equal to the thickness of the substrate, so the top surface of the substrate is exactly at the same level as (coplanar with) the upper surface of the carrier outside the recess. However, even with this arrangement, a vacuum leak develops when the gap between the edge of the substrate and the carrier traverses the vacuum seal due to movement of the stage on which the carrier rides. This is because inevitably the substrate cannot fit exactly against the corresponding edge of the recess in the carrier. During the time this gap traverses the vacuum seal, the annular regions of the seal are partially vented. In other words, the gap is a leak that introduces a large quantity of undesirable air into the vacuum portions of the seal. This of course undesirably allows the atmospheric air to enter into the electron beam column thus possibly contaminating the column, and at a minimum requiring a certain amount of time to reestablish the proper vacuum level after the gap is traversed.

SUMMARY

The above-described prior art vacuum seal is modified so that it includes an inner conical baffle that is raised a few millimeters from the substrate surface, and the outside surface of the inner conical baffle is at an intermediate vacuum of, e.g., about $10^{-4}$ torr instead of the conventional high vacuum at $10^{-6}$ torr. The high vacuum does not extend all the way down to the substrate. Operation of prior art environmental scanning electron microscopes has shown that one may allow the beam to pass through a short distance of intermediate vacuum (e.g., the $10^{-4}$ torr) between the hole for the beam in the upper part of the inner conical baffle and the substrate without ill effects. In addition, there is provided an isolation valve which is, in one embodiment, flat in shape and located just above the inner conical baffle. In addition, the backscatter detector is located in the intermediate vacuum outside the inner conical baffle instead of in the high vacuum as it is in the prior art.

During loading and unloading of the substrate, the isolation valve is closed to isolate the high vacuum which is along most of the beam path inside the electron beam column. Then the substrate-carrier gap is rapidly moved through the seal region, briefly venting the intermediate vacuum regions to the ambient air or nitrogen. The small high vacuum region between the valve and inner conical baffle interior is only partially vented. When the seal is re-established on the substrate surface, the intermediate and forevacuum pumps quickly pump down to their normal (rather modest) values, even though they do not have associated isolation valves. After a brief pause, the isolation valve is opened, and the small high vacuum region between the isolation valve and inner differential pumping region is evacuated by the conventional high vacuum pumps. Since this region has a small surface area and volume, it can fairly quickly return to its vacuum value of $10^{-6}$ torr even though it may retain some water vapor on its surfaces.

If the inner conical baffle were too large and located at the level of the substrate surface, and if there were no isolation valve, more water vapor would invade the high vacuum system along the beam path, and it would take longer to recover conditions necessary to use the beam to expose the substrate. In one embodiment, therefore, the present system does not require the isolation valve.

In one embodiment having the isolation valve, the isolation valve is located between the upper portion of the electron beam column and the inner conical baffle which is the innermost portion of the differentially pumped vacuum seal. The isolation valve is electrically linked to a control computer which controls the electron beam machine, thus allowing operation of the isolation valve in conjunction with movement of the stage on which the carrier and target substrate (workpiece) ride.

The gap between the lower portion of the vacuum seal and the surface of the substrate is maintained by the air bearings. Thus desirably the isolation valve and the associated inner conical baffle allow the gap between the substrate and the carrier to pass under the vacuum seal during loading and unloading of the substrate.

BRIEF DESCRIPTION OF THE DRAWINGS

The present invention may be better understood, and its numerous objects, features, and advantages made apparent to those skilled in the art by referencing the accompanying drawing.

FIG. 1 shows in cross-section a differentially pumped vacuum seal in accordance with this invention.

DETAILED DESCRIPTION

The present vacuum seal in many respects is similar to those in the above-described patent disclosures and has similar applications. The electron (or ion) beam column with which it is associated is of the type well-known in the field. This invention is not limited to electron beam lithography, but also is applicable to electron beam inspection, electron beam microscopy, ion beam lithography, and ion beam microscopy.

As mentioned above, one use of the present vacuum seal is for electron beam (or ion beam) lithography processing of a substrate which is typically a semiconductor wafer or a reticle blank being patterned by an electron beam. In this use, the substrate carries a layer of resist sensitive to exposure by the incident electron or ion beam and which is exposed by the electron or ion beam. Development of the exposed resist defines a pattern thereon which is used for subsequent processing, typically etching, etc.

FIGURES 5 to 7 of the above-mentioned U.S. Pat. No. 4,607,167 show a prior art vacuum envelope similar in some respects to the one disclosed herein. FIG. 7 shows the entire electron beam lithography apparatus in a side view in cross-section. FIG. 6 shows (inverted) the actual vacuum seal structure. FIG. 5 shows an end-view of the structure of FIG. 6. Since in many respects the present apparatus is similar to these, details of the present vacuum seal which are similar to those of the prior art are not further disclosed herein.

Present FIG. 1 shows a differentially pumped vacuum seal in accordance with this invention and corresponds to the lower portion of FIG. 7 of the above-mentioned U.S. Pat. No. 4,607,167. FIG. 1 is a cross-section side view, not to scale. Illustrated in FIG. 1 is a carrier 10 on which sits a substrate (semiconductor wafer or reticle blank) 12. Carrier 10 is typically a vacuum chuck or gravity clamped kinematic mount with a surface coplanar with that of the substrate. A gap 16 lies between the edge of the substrate 12 and the raised portion of the carrier 10. In the prior art, gap 16 causes the above-mentioned problem when the vacuum seal passes thereover. In the upper part of FIG. 1 is an electron beam column 20; only the lower portion thereof is shown. Electron beam column 20 is conventional and terminates in a structural member (flange) 22. The materials of the components shown herein are conventional. For instance, structural elements within the electron beam column are typically iron and the elements near the electron beam are typically of titanium or aluminum.

Extending from flange 22 is the actual vacuum seal structure. This is a differentially pumped vacuum seal of the general type described above. In this case there are three vacuum zones separated by annular gaps typically 5–10 μm high by 1 μm wide. The first gap is zone 24, which is the forevacuum pumped down to 1 torr, for instance. Inside this is an intermediate vacuum 26 which is pumped down to, for instance, $10^{-4}$ torr. Inside this is the beam column vacuum 38 which is a high vacuum pumped down to, for instance, $10^{-6}$ torr. However, here the lower part 39 of the vacuum is not at $10^{-6}$ torr but is at the intermediate $10^{-4}$ torr vacuum.

As shown, the electron beam 28 is mostly within the high ($10^{-6}$ torr) vacuum 38. Backscatter detector 30 is a circular structure concentric to a differential pumping baffle 34. Detector 30 here is in the intermediate ($10^{-4}$ torr) vacuum. Note that the lower surface of the inner conical baffle 34 is about 1 to 5 mm above the lower surface of baffle 46 or baffle 48. It is to be understood that the structures shown herein are typically concentric to the electron beam 28 and axially symmetric, as in prior art vacuum seals.

Also shown in FIG. 1 is an isolation valve 40 (depicted schematically). This is, for instance, a relatively flat shaped (approximately 5 mm thick) remotely pneumatic operated vacuum valve which opens and closes. In its closed position, it isolates the electron beam column 20 from the interior of the baffle 34. This closed position also of course prevents passage of the electron beam 28. In the open position of the isolation valve 40, the electron beam 28 passes through the central opening in conical baffle 34 down to the surface of the substrate 12. Note that FIG. 1 is not to scale; the distance from the lower surface of value 40 to substrate 12 is, e.g., 10 to 15 mm. Valve 40 is preferably of non-magnetic material and flat shaped so as to minimize the length of the electron beam path below the electron beam lens (not shown but located above the FIG. 1 structures). In one embodiment, valve 40 is not provided.

In order to maintain the necessary very small gap between the lower portions of the vacuum seal and the surface of the substrate 12, air bearing jets 44a, 44b are provided. These are also radially symmetric and have a configuration of a type known in the art.

The isolation valve 40 is operated during movement of the carrier 10. Carrier 10 moves typically in the Y and X directions (as shown in the lower portion of the figure) in a plane parallel to that of the principal surface of substrate 12. When the gap 16 passes under the lower portions of the vacuum seal (during substrate loading or unloading), this causes a substantial change in the vacuum condition since there is no longer a seal between the lower portions of the vacuum seal and the substrate 12, due to gap 16. This obviously disturbs the vacuum. In order to prevent a large quantity of outside air from being sucked into the vacuum and undesirably reducing same, immediately prior to passage of the gap 16 underneath the open portions of the vacuum seal, the isolation valve 40 is closed. Of course, during this loading or unloading time no lithography exposure is occurring anyway. When the substrate 12 is loaded and under the open portion of the vacuum seal, the gap 16 is no longer a problem; the isolation valve 40 is then opened again to resume lithography.

This operation requires a control system (depicted schematically in FIG. 1) linked between the control terminals of the isolation valve 40 and a sensor 44 which conventionally senses a relative position of carrier 10 in the X-Y plane. The controller function 50 is typically carried out by a suitably programmed general purpose computer or microprocessor which is part of the overall lithography machine.

Therefore, the differentially-pumped vacuum seal connects the electron beam path vacuum 38 to the substrate 12. The inner conical baffle 34 is raised above the substrate surface and its exterior below its beam opening is at an intermediate vacuum instead of a high vacuum. The air bearing jets 44a, 44b maintain the proper (e.g., 5–10 $\mu$m) spacing between the remainder of the vacuum seal and the upper surface of the substrate 12. The inner conical baffle 34 provides an additional aperture and houses the isolation valve 40. Valve 40 allows the gap 16 between the edge of the substrate 12 and the carrier to pass under the vacuum seal during substrate loading, with minimal detriment to the high vacuum surrounding the electron beam 28.

Further modifications will be apparent to one skilled in the art in light of this disclosure, and are intended to fall within the scope of the appended claims.

We claim:

1. A charged particle beam apparatus comprising:
   a support for a workpiece;
   a charged particle beam column defining at its end adjacent the workpiece a conical baffle; and
   a structure defining at least one annular differential vacuum pumping passage surrounding the baffle;
   wherein an opening in the conical baffle coaxial to an axis of the charged particle beam is spaced apart from the workpiece and a coplanar surface of the support by a greater distance than is a portion of the structure which defines the annular passage, and an interior of the conical baffle is at higher vacuum than is its exterior.

2. The apparatus of claim 1, further comprising:
   an isolation valve coupling the column to the conical baffle, whereby the isolation valve is operable to allow by the charged particle beam to pass from the column through the conical baffle during exposure of the workpiece by the charged particle beam.

3. The apparatus of claim 1, wherein a diameter of the opening in the conical baffle for passage of the beam is of smaller diameter than in the workpiece.

4. The apparatus of claim 2, wherein the support defines a recess accommodating the workpiece and is movable in a plane normal to an axis of the charged particle beam, whereby the isolation valve is closed when the conical baffle passes over an edge of the workpiece at the gap between the recess and workpiece.

5. The apparatus of claim 1, further comprising a gas bearing dispersed on a surface of the structure which opposes a surface of the workpiece, thereby maintaining a predetermined spacing between the surface of the workpiece and the structure.

6. The apparatus of claim 3, further comprising:
   a controller operably coupled to the isolation valve, thereby to open and close the valve; and
   a sensor located to indicate a position of the edge of the workpiece and coupled to the controller, thereby to cause the controller to close the isolation valve when the edge of the workpiece passes under the conical baffle.

7. The apparatus of claim 1, further comprising a charged particle detector outside of and concentric to the conical baffle, thereby to detect charged particles backscattered from the workpiece.

8. The apparatus of claim 1, wherein the opening in the conical baffle is spaced apart from the workpiece and a coplanar surface of the support by a distance of at least 1 mm.

9. A method of operating a charged particle beam apparatus, wherein a beam of charged particles is transmitted from a charged particle beam column through a vacuum to a workpiece, only a portion of the workpiece being in the vacuum, comprising the acts of:
   moving the workpiece in a plane normal to an axis of the beam;
   differentially vacuum pumping concentric to the beam and adjacent to the workpiece;
   vacuum pumping a region in a conical baffle concentric to the beam from a first region lying above the workpiece by a greater distance than is a second annular region concentric to the first region, and wherein a portion of the first region adjacent the beam is at a higher vacuum than is the second annular region.

10. The method of claim 9, further comprising the acts of:
    closing off a passage for the beam between the column and the differentially pumped regions when at least a portion of the differentially pumped regions is adjacent an edge of the workpiece; and
    opening up the passage when the differentially pumped regions return adjacent the workpiece.

11. The method of claim 9, further comprising the act of providing a flow of pressurized gas between a distal portion of the column and the workpiece, thereby maintaining a predetermined spacing between the workpiece and a distal portion of the column.

12. The method of claim 10, further comprising the acts of:
    indicating a position of the workpiece relative to the column; and
    in response to the indicated position, opening or closing the passage.

13. The method of claim 9, wherein the second annular region is an exterior of the conical baffle.

* * * * *